(12) United States Patent
Yu et al.

(10) Patent No.: US 9,413,140 B2
(45) Date of Patent: Aug. 9, 2016

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Hung-Chang Yu, Hsinchu (TW); Ying-Hao Kuo, Hsinchu (TW); Kai-Chun Lin, Hsinchu (TW); Yue-Der Chih, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 125 days.

(21) Appl. No.: 14/133,699

(22) Filed: Dec. 19, 2013

(65) Prior Publication Data

US 2015/0180210 A1    Jun. 25, 2015

(51) Int. Cl.
| | |
|---|---|
| *H04B 10/00* | (2013.01) |
| *H01S 5/30* | (2006.01) |
| *H04B 10/43* | (2013.01) |
| *H01S 5/02* | (2006.01) |
| *H01S 5/026* | (2006.01) |
| *H01S 5/028* | (2006.01) |
| *H01S 5/183* | (2006.01) |

(52) U.S. Cl.
CPC ............... *H01S 5/3027* (2013.01); *H01S 5/021* (2013.01); *H01S 5/026* (2013.01); *H01S 5/0261* (2013.01); *H04B 10/43* (2013.01); *H01S 5/0285* (2013.01); *H01S 5/183* (2013.01)

(58) Field of Classification Search
CPC ...................................................... H04B 10/801
See application file for complete search history.

(56) References Cited

U.S. PATENT DOCUMENTS

| | | | | | |
|---|---|---|---|---|---|
| 4,966,430 | A | * | 10/1990 | Weidel ..................... | G02B 6/43 257/84 |
| 5,949,097 | A | * | 9/1999 | Hirata .................. | H01L 27/0605 257/197 |
| 6,821,029 | B1 | * | 11/2004 | Grung ...................... | G02B 6/43 385/88 |
| 7,149,236 | B1 | * | 12/2006 | Verma .................... | B82Y 20/00 372/43.01 |
| RE41,336 | E | * | 5/2010 | Kondow ................ | B82Y 20/00 257/184 |
| 9,184,834 | B1 | * | 11/2015 | Zhang ................ | H04B 10/0775 |

(Continued)

OTHER PUBLICATIONS

Dynamic Behavior of SRAM Data Retention and a Novel Transient Voltage Collapse Technique for 0.6V 32nm LP SRAM.

*Primary Examiner* — Danny Leung
(74) *Attorney, Agent, or Firm* — Cooper Legal Group, LLC

(57) ABSTRACT

A semiconductor arrangement and a method of forming the same are described. A semiconductor arrangement includes a first layer including a first optical transceiver and a second layer including a second optical transceiver. A first serializer/deserializer (SerDes) is connected to the first optical transceiver and a second SerDes is connected to the second optical transceiver. The SerDes converts parallel data input into serial data output including a clock signal that the first transceiver transmits to the second transceiver. The semiconductor arrangement has a lower area penalty than traditional intra-layer communication arrangements that do not use optics for alignment, and mitigates alignment issues associated with conventional techniques.

20 Claims, 10 Drawing Sheets

(56) References Cited

U.S. PATENT DOCUMENTS

| | | | | |
|---|---|---|---|---|
| 2002/0076841 A1* | 6/2002 | Chang | H01S 5/0014 | 438/15 |
| 2003/0223756 A1* | 12/2003 | Tatum | H04B 10/40 | 398/135 |
| 2004/0008745 A1* | 1/2004 | Magoon | H04B 10/504 | 372/38.02 |
| 2004/0028100 A1* | 2/2004 | Nakahara | H01S 5/041 | 372/38.02 |
| 2005/0135732 A1* | 6/2005 | Crow | G02B 6/43 | 385/15 |
| 2006/0002663 A1* | 1/2006 | Posamentier | G02B 6/4201 | 385/88 |
| 2014/0363121 A1* | 12/2014 | Lai | G02B 6/12002 | 385/14 |
| 2015/0132008 A1* | 5/2015 | Kuo | H04B 10/803 | 398/135 |
| 2015/0180210 A1* | 6/2015 | Yu | H01S 5/3027 | 398/138 |

* cited by examiner

SEMICONDUCTOR ARRANGEMENT AND FORMATION THEREOF

BACKGROUND

Three dimensional (3D) integrated circuits (IC) structures have multiple layers. Communication between the multiple layers is typically performed by "pins" comprising one of interlayer vias or through silicon vias.

DETAILED DESCRIPTION

Figure 1:
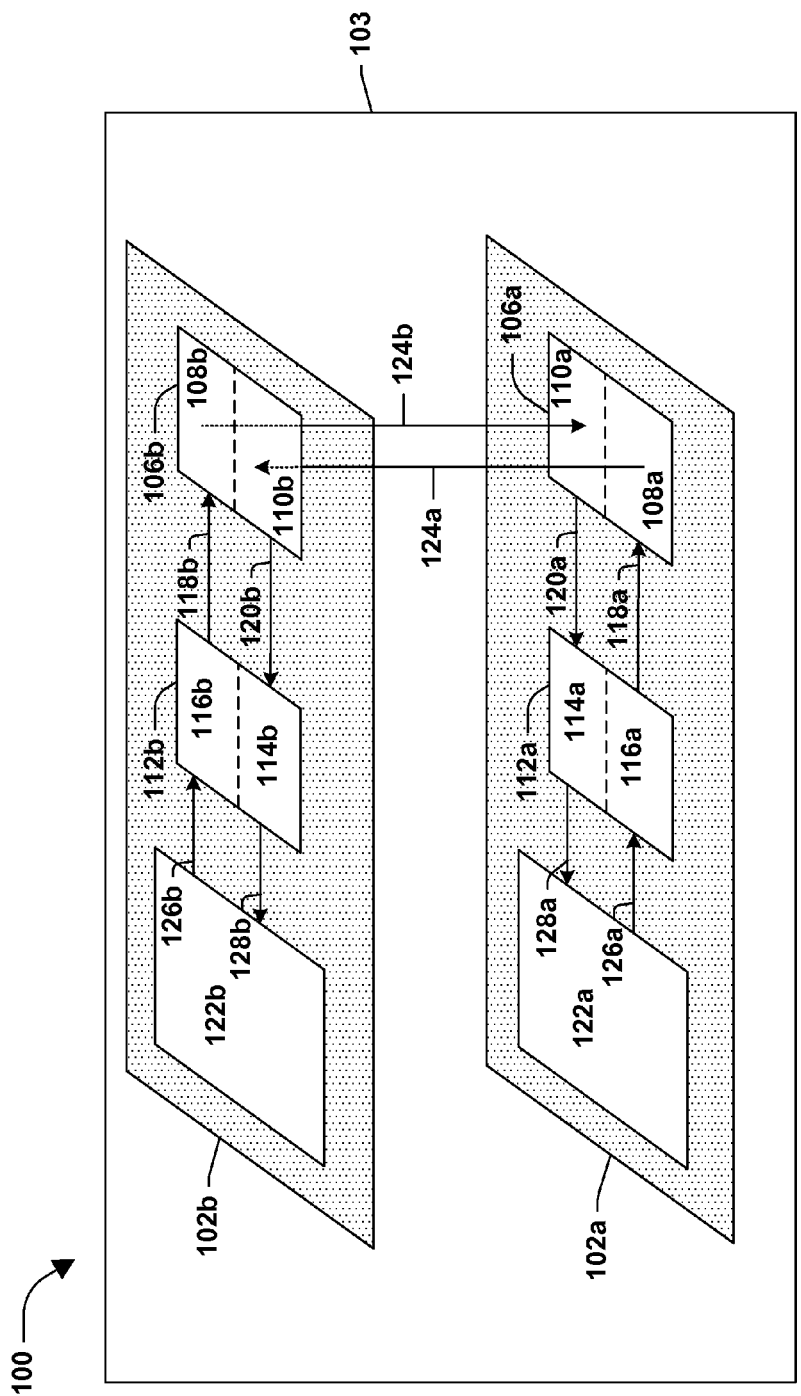
FIG. 1 is an illustration of a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

According to some embodiments, a semiconductor arrangement comprises a three dimensional (3D) integrated circuit (IC) structure comprising a first layer comprising a first optical transmitter and a second layer comprising a second optical transmitter, the second layer over the first layer. In some embodiments, the first optical transmitter is configured to transmit data from the first layer to the second layer and the second optical transmitter is configured to transmit data from the second layer to the first layer. In some embodiments, the first layer comprises at least one of a first optical receiver or a first optical transceiver, the first optical transceiver comprising the first optical transmitter and the first optical receiver. In some embodiments, the second layer comprises at least one of a second optical receiver or a second optical transceiver, the second optical transceiver comprising the second optical transmitter and the second optical receiver. In some embodiments, the first layer comprises at least one of a first serializer connected to the first optical transmitter or a first deserializer connected to the first optical receiver. In some embodiments, the second layer comprises at least one of a second serializer connected to the second optical transmitter or a second deserializer connected to the second optical receiver. In some embodiments, transmitted signals are in a serialized format comprising a first serial data output and a second serial data output, such as through the use of the first serializer or the second serializer. In some embodiment, a first serializer/deserializer (SerDes) comprising the first serializer and the first deserializer is connected to the first optical transceiver, which converts electrical signals, such as the first serial data output, into modulated light signals at an optical wavelength between 0.9-6.0 µm. In some embodiments, optical wavelengths between 0.9-6.0 µm are transparent or semi-transparent on a silicon substrate. In some embodiments, a number of pins required for the semiconductor arrangement to function is reduced compared to an arraignment without an optical transmitter and an optical receiver, or a serializer and a deserializer. In some embodiments, communication in a 3D IC structure is achieved through coupling optical signals to transmit data from at least one of the first layer of the 3D IC structure to the second layer of the 3D IC structure or the second layer of the 3D IC structure to the first layer of the 3D IC structure. In some embodiments, the semiconductor arrangement comprising the 3D IC structure does not require an interlayer via (ILV) or through silicon via (TSV) to facilitate communication between the first layer of the 3D IC structure and the second layer of the 3D IC structure. In some embodiments, a semiconductor arrangement without an optical transmitter and an optical receiver, or a serializer and a deserializer has ILV misalignment between a first layer and a second layer, due to the ILV having a small size between about 1 µm to about 10 µm. In some embodiments, a semiconductor arrangement without an optical transmitter and an optical receiver, or a serializer and a deserializer has a TSV. In some embodiments, the TSV has a size between about 75 µm to about 150 µm, which is a greater size than the ILV and thus has a greater area penalty than the ILV. In some embodiments, the semiconductor arrangement comprising the first optical transmitter connected to the first serializer on the first layer and the second optical receiver connected to the second deserializer on the second layer, has a smaller area than the TSV and achieves alignment through aligning the data transmission, comprising an alignment signal, of the first optical transmitter to the second optical receiver, and thus lacks the misalignment of the ILV.

FIG. 1 illustrates a semiconductor arrangement 100, according to some embodiments. In some embodiments, the semiconductor arrangement 100 comprises a three dimensional (3D) integrated circuit (IC) structure 103 comprising a first layer 102a and a second layer 102b. In some embodiments, the first layer 102a comprises first memory macros 122a connected to a first serializer/deserializer (SerDes) 112a. In some embodiments, the first SerDes 112a comprises a first serializer 116a and a first deserializer 114a. In some embodiments, the first SerDes 112a is connected to a first optical transceiver 106a. In some embodiments, the first optical transceiver 106a comprises a first optical receiver 110a and a first optical transmitter 108a. In some embodiments, the first serializer 116a converts a first parallel data input 126a from the first memory macros 122a into a first serial data output 118a. In some embodiments, the first deserializer 114a converts a first serial data input 120a from the first optical receiver 110a into a first parallel data output 128a. In some embodiments, the first deserializer 114a sends the first parallel data output 128a to the first memory macros 122a. In some embodiments, the first serializer 116a sends the serial data output 118a to the first optical transmitter 108a. In some embodiments, the first optical transmitter 108a transmits data 124a from the first layer 102a to the second optical transceiver 106b on the second layer 102b. In some embodiments, at least one of the first serial data input 120a, the first serial data output 118a, the first parallel data input 126a, the first parallel data output 128a or the data 124a comprise a clock signal. In some embodiments, the second optical transceiver 106b is connected to a second SerDes 112b. In some embodiments, the second SerDes 112b comprises a second serializer 116b and a second deserializer 114b. In some embodiments, the second optical transceiver 106b comprises a second optical transmitter 108b and a second optical receiver 110b. In some embodiments, the second optical receiver 110b is connected to the second deserializer 114b. In some embodiments, the second optical receiver 110b sends a second serial data input 120b to the second deserializer 114b. In some embodiments, the second deserializer 114b converts the second serial data input 120b to a second parallel data output 128b. In some embodiments, the second deserializer 114b is connected to second memory macros 122b. In some embodiments, the second deserializer 114b sends the second parallel data output 128b to the second memory macros 122b on the second layer 102b. In some embodiments, the second memory macros 122b is connected to the second serializer 116b. In some embodiments, the second memory macros 122b sends a second parallel input 126b to the second serializer 116b. In some embodiments, the second serializer 116b converts the second parallel data input 126b into a second serial output 118b. In some embodiments, the second serializer 116b is connected to the second optical transmitter 108b. In some embodiments, the second serializer 116b sends a second serial data output 118b to the second optical transmitter 108b. In some embodiments, the second optical transmitter 108b transmits data 124b from the second layer 102b to the first optical transceiver 106a on the first layer 102a. In some embodiments, at least one of the second serial data input 120b, the second serial data output 118b, the second parallel data input 126b, the second parallel data output 128b or the data 124b comprise a clock signal. Although two layers are shown, multiple layers with multiple optical transceivers connected to multiple SerDes are contemplated. Although optical transmitters and optical receivers that are part of optical transceivers are shown, separate components are contemplated such that a layer has at least one of an optical transmitter or an optical receiver that is or is not part of an optical transceiver.

According to some embodiments, the first optical transmitter 108a comprises at least one of a first internal optical source or a first external optical source. According to some embodiments, the second optical transmitter 108b comprises at least one of a second internal optical source or a second external optical source. According to some embodiments, a first optical transmitter 108a with the first internal optical source or the second optical transmitter 108b with the second internal optical source are illustrated in FIGS. 2-7. According to some embodiments, the first optical transmitter 108a with the first external optical source or the second optical transmitter 108b with the second external optical source are illustrated in FIGS. 8-13.

Figure 2:
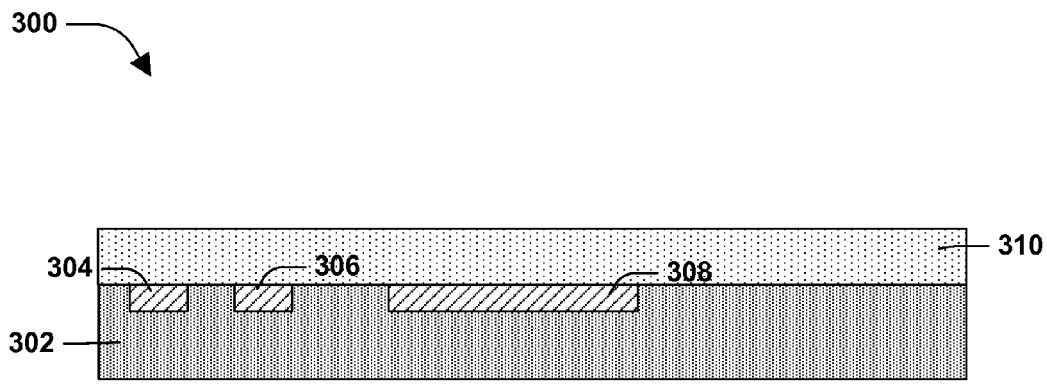
FIG. 2 is an illustration of a semiconductor arrangement, according to some embodiments.

Turning to FIG. 2, a passivation layer 310 is illustrated over a substrate 302, where the substrate 302 comprises a first active area 304 and a second active area 306, and a first doped area 308, according to some embodiments. In some embodiments, the substrate 302 comprises at least one of silicon, polysilicon, or germanium. In some embodiments, the substrate 302 comprises a compound group of at least one of group 3 elements, such as aluminum, indium, or gallium, or group 5 elements, such as arsenic, phosphorous, antimony. According to some embodiments, the substrate 302 comprises at least one of an epitaxial layer, a silicon-on-insulator (SOI) structure, a wafer, or a die formed from a wafer. In some embodiments, the first active area 304, the second active area 306 and the first doped area 308 are formed by implantation of a first dopant, such as boron. In some embodiments, the first active area 304 and the second active area 306 comprise at least one of a source or a drain. In some embodiments, the first doped area 308 comprises a seed layer. In some embodiments, the passivation layer 310 comprises at least one of $SiO_2$ or silicon nitride ($Si_3N_4$). In some embodiments, the passivation layer 310 comprises a thickness of between about 2 μm to about 50 μm.

Figure 3:
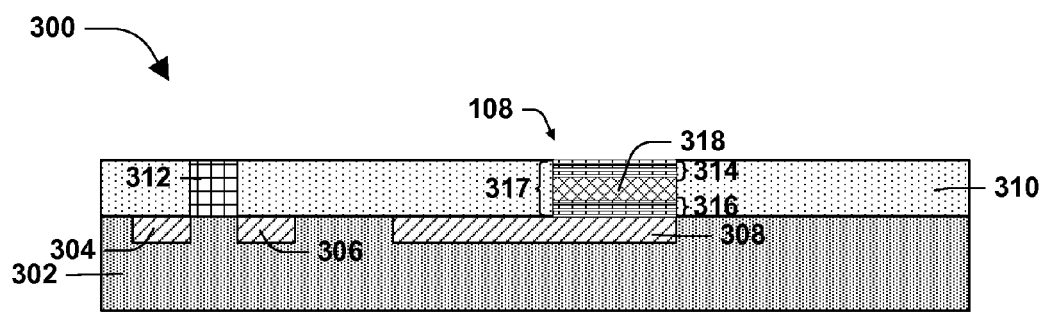
FIG. 3 is an illustration of a semiconductor arrangement, according to some embodiments.

Turning to FIG. 3, a gate 312 is illustrated between the first active area 304 and the second active area 306 and an optical transmitter 108 is illustrated in the passivation layer 310, according to some embodiments. In some embodiments, the gate 312 is formed by forming a first opening in the passivation layer 310 between the first active area 304 and the second active area 306, and forming the gate 312, such that the gate 312, the first active area 304 and the second active area 306 comprise a transistor. In some embodiments, the gate 312 comprises at least one of a polysilicon or a metal. In some embodiments, the gate 312 comprises a high dielectric constant material in contact with the substrate 302. In some embodiments, the first optical transmitter 108a as shown in FIG. 1 comprises a first internal optical source and the second optical transmitter 108b shown in FIG. 1 comprises a second internal optical source. In some embodiments, the first internal optical source comprises a first vertical cavity laser 317. In some embodiments, the first vertical cavity laser 317 comprises a top mirror 314, a gain region 318 and a bottom mirror 316, such that the gain region 318 is between the top mirror 314 and the bottom mirror 316. In some embodiments, the top mirror 314 and the bottom mirror 316 comprise alternating mirror layers, such that even mirror layers have the same composition and odd mirror layers have the same composition, such that a first mirror layer has the same composition as a third mirror layer, and a second mirror layer has the same composition as a fourth mirror layer. In some embodiments, the first vertical cavity laser 317 is grown, such as by epitaxial growth. In some embodiments, the first vertical cavity laser 317 is formed by high vacuum chemical vapor deposition (HVCVD). In some embodiments, at least one of the top mirror 314 or the bottom mirror 316 are formed by alternating different gasses in a chamber during HVCVD. In some embodiments, the even mirror layers comprise at least one of a first optical material or a second optical material, such that the first optical material has different optical properties than the second optical material. In some embodiments, the odd mirror layers comprise a first optical material or a second optical material, such that the odd mirror layers comprise the first optical material when the even mirror layer comprise the second optical material and the odd mirror layers comprise the second optical material when the even layers comprise the first optical material. In some embodiments, the first vertical cavity laser 317 comprises at least one of silicon, germanium, tin, or at least one of group 3 elements, such as aluminum, indium, or gallium, or group 5 elements, such as arsenic, phosphorous, antimony. In some embodiments, the gain region 218 comprises at least one of quantum wells, quantum dots, or nano-crystals.

Figure 4:
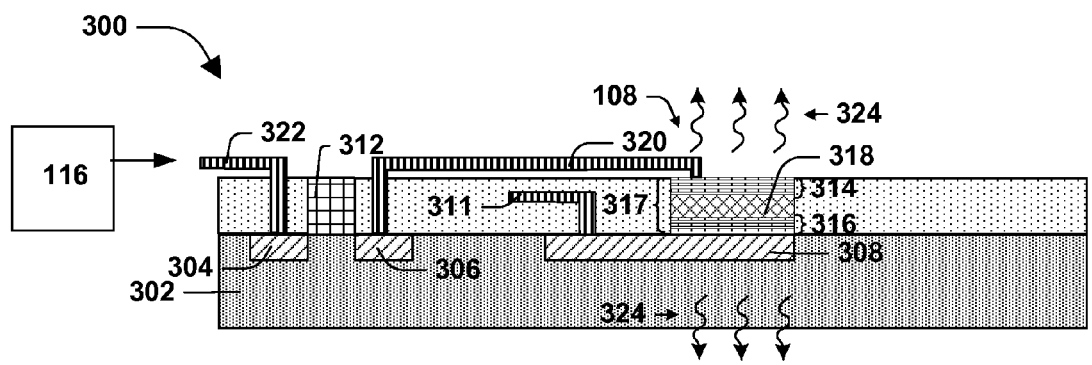
FIG. 4 is an illustration of a semiconductor arrangement, according to some embodiments.

Turning to FIG. 4, a first connect 322 connected to the first active area 304, a second connect 320 connected to the second active area 306, and a third connect 311 connected to the first doped area 308 are illustrated, according to some embodiments. In some embodiments, the first connect 322, the second connect 320, and the third connect 311 comprise a conductive material, such as metal. In some embodiments at least one of the first connect 322, the second connect 320, or the third connect 311 comprise different conductive materials. In some embodiments, the transistor acts as switch to activate the first vertical cavity laser 317. In some embodiments, the serializer 116 sends a serial data output 118 to the first vertical cavity laser 317 comprising the data 124. In some embodiments, the first connect 322 supplies a current to the first active area 304 and the second connect 320 supplies an activation current to the first vertical cavity laser 317. In some embodiments, the third connect 311 is connected to ground, such that the current flowing through the first vertical cavity laser 317 goes to ground. In some embodiments, the first vertical cavity laser 317 transmits modulated light signals 324, where the arrows indicate the propagation direction of the data transmitted as modulated light signals 324. In some embodiments, the data 124 is converted into modulated light signals 324 that transmit the data 124 to an optical receiver on a different layer than the layer that the first vertical cavity laser 317 occupies. In some embodiments, the first optical transmitter 108a, such as illustrated in FIG. 1, comprises the first vertical cavity laser 317 on the first layer 102a, such as illustrated in FIG. 4. In some embodiments, the second optical transmitter 108b, such as illustrated in FIG. 1, comprises a second vertical cavity laser on the second layer 102b, such as illustrated in FIG. 4.

Figure 5:
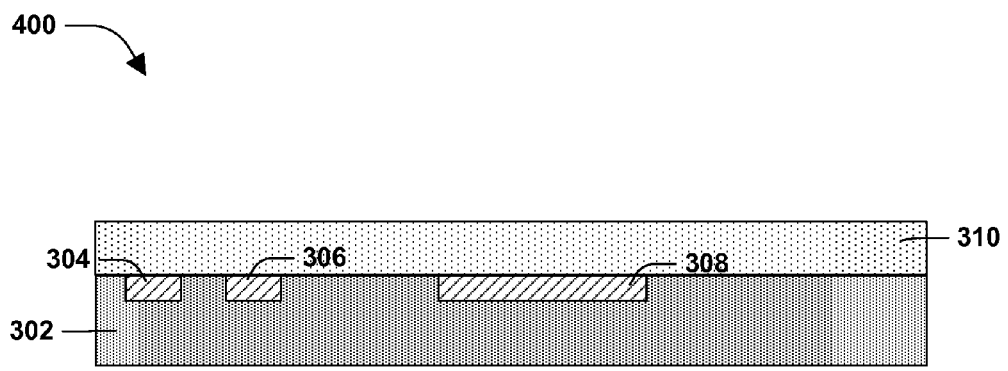
FIG. 5 is an illustration of a semiconductor arrangement, according to some embodiments.

Turning to FIG. 5, the substrate 302, the first active area 304, the second active area 306, the first doped area 308 and the passivation layer 310 are illustrated, which are formed as described above with regards to FIG. 2, according to some embodiments.

Figure 6:
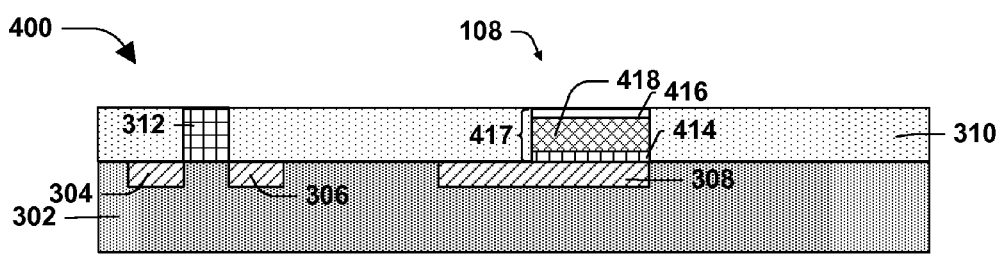
FIG. 6 is an illustration of a semiconductor arrangement, according to some embodiments.

In FIG. 6, a gate 312 between the first active area 304 and the second active area 306 in the passivation layer 310, which forms a transistor, and an optical transmitter 108 in the passivation layer 310 are illustrated, according to some embodiments. In some embodiments, the gate 312 is formed as described above with regards to the gate 312, as illustrated in FIG. 3. In some embodiments, the optical transmitter 108 comprises an internal optical source. In some embodiments, the internal optical source comprises a first laser 417, where the first laser 417 comprises at least one of a SiGe laser or a hybrid laser. In some embodiments, the first laser 417 comprises at least one of quantum wells, quantum dots, or nano-crystals. In some embodiments, the first laser 417 comprises at least one of silicon, germanium, tin, or at least one of group 3 elements, such as aluminum, indium, or gallium, or group 5 elements, such as arsenic, phosphorous, antimony. In some embodiments, the first laser 417 is formed by at least one of epitaxial growth or wafer-level bonding. In some embodiments, the first laser 417 is formed in a second opening in the passivation layer 310. In some embodiments, the first laser 417 has a first junction 414, a second junction 418 and a first contact 416. In some embodiments, the first junction 414 is at least one of a positive type junction or a negative type junction. In some embodiments, the second junction 418 is a positive type junction when the first junction 414 is a negative type junction. In some embodiments, the second junction 418 is a negative type junction when the first junction 414 is a positive type junction. In some embodiments, the first contact 416 is a low resistance contact, such as a metal.

Figure 7:
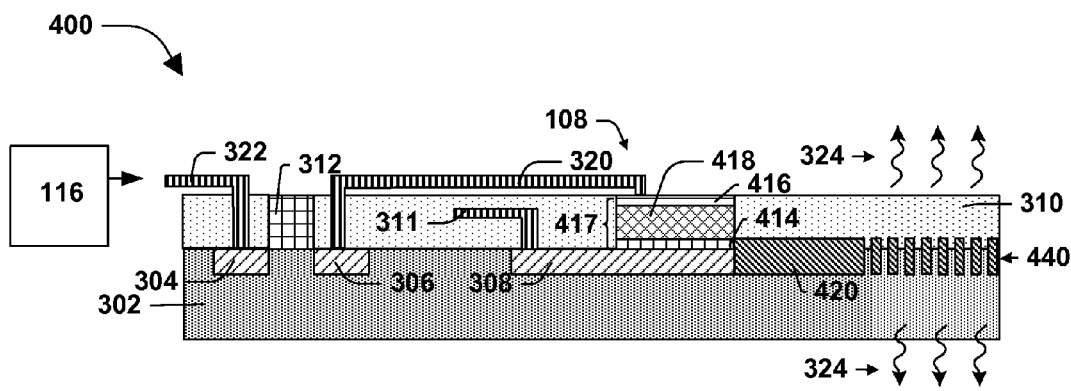
FIG. 7 is an illustration of a semiconductor arrangement, according to some embodiments.

In FIG. 7, the first laser 417 in contact with a waveguide 420 and a grating coupler 440 in contact with the waveguide 420 is illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 4. In some embodiments, the second connect 320 is connected to the second active area 306 and the first contact 416 of the first laser 417. In some embodiments, the waveguide 420 comprises an SOI waveguide, a dielectric waveguide, or a plasmonic waveguide. In some embodiments, the dielectric waveguide comprises at least one of patterned silicon nitride, amorphous silicon, or high dielectric material surrounded by a low dielectric constant material, such as silicon oxide. In some embodiments, the plasmonic waveguide comprises patterned metal nano-wires surrounded by a dielectric material. In some embodiments, the grating coupler 440 comprises one of a metal or a high dielectric material. In some embodiments, the grating coupler 440 comprises several segments with a distance between each segment. In some embodiments, the first laser 417 generates a laser signal comprising data 124, such as a serial data output 118 from the serializer 116, which passes through the waveguide 420 to the grated coupler 440. In some embodiments, the grated coupler 440 transforms the laser signal into the modulated light signal 324. In some embodiment, the grating coupler 440 transmits the modulated the light signals 324, where the arrows indicate the propagation direction of the data 124 transmitted as the modulated light signal 324. In some embodiments, the first optical transmitter 108a, such as illustrated in FIG. 1, comprises the first laser 417 in contact with the first waveguide 420 and the first grating coupler 440 on the first layer 102a, such as illustrated in FIG. 7. In some embodiments, the second optical transmitter 108b, such as illustrated in FIG. 1, comprises a second laser 417 in contact with the second waveguide 420 and the second grating coupler 440 on the second layer 102b, such as illustrated in FIG. 7.

Figure 8:
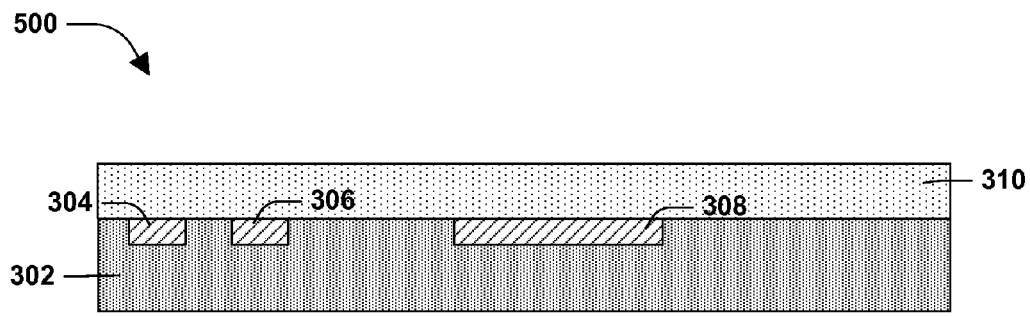
FIG. 8 is an illustration of a semiconductor arrangement, according to some embodiments.

Turning to FIG. 8, the substrate 302, the first active area 304, the second active area 306, the first doped area 308 and the passivation layer 310 are illustrated, which are formed as described above with regards to FIG. 2, according to some embodiments.

Figure 9:
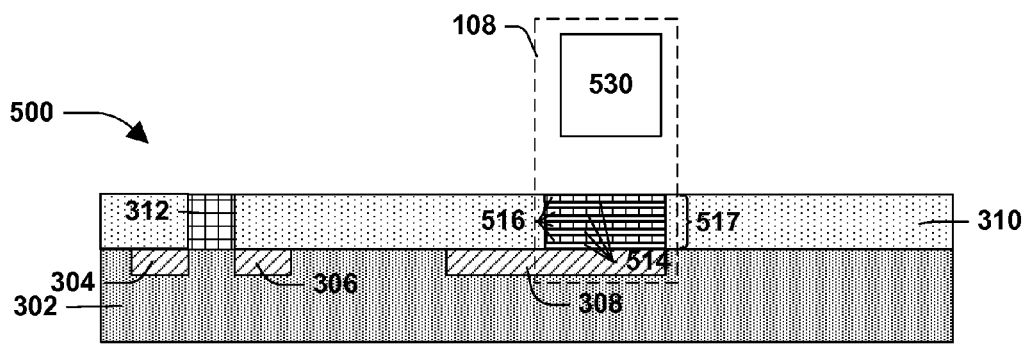
FIG. 9 is an illustration of a semiconductor arrangement, according to some embodiments.

In FIG. 9, a gate 312 between the first active area 304 and the second active area 306 in the passivation layer, which forms a transistor, and an optical transmitter 108 comprising an external laser 530 and an electro-absorption modulator 517 are illustrated, according to some embodiments. In some embodiments, the gate 312 is formed as described above with regards to the gate 312, as illustrated in FIG. 3. In some embodiments, the external laser 530 comprises a laser, such as a vertical cavity laser or a fiber array with lens coupler. In some embodiments, the electro-absorption modulator 517 is formed in a third opening in the passivation layer over the first doped area 308. In some embodiments, the electro-absorption modulator 517 comprises even modulator layers 516 and odd modulator layers 514, where the even modulator layers 516 have a different composition having different optical properties than the odd modulator layers 514. In some embodiments, the electro-absorption modulator 517 comprises at least one of silicon, germanium, tin, or at least one of group 3 elements, such as aluminum, indium, or gallium, or group 5 elements, such as arsenic, phosphorous, antimony. In some embodiments, the electro-absorption modulator 517 is formed by at least one of epitaxial growth or wafer-level bonding.

Figure 10:
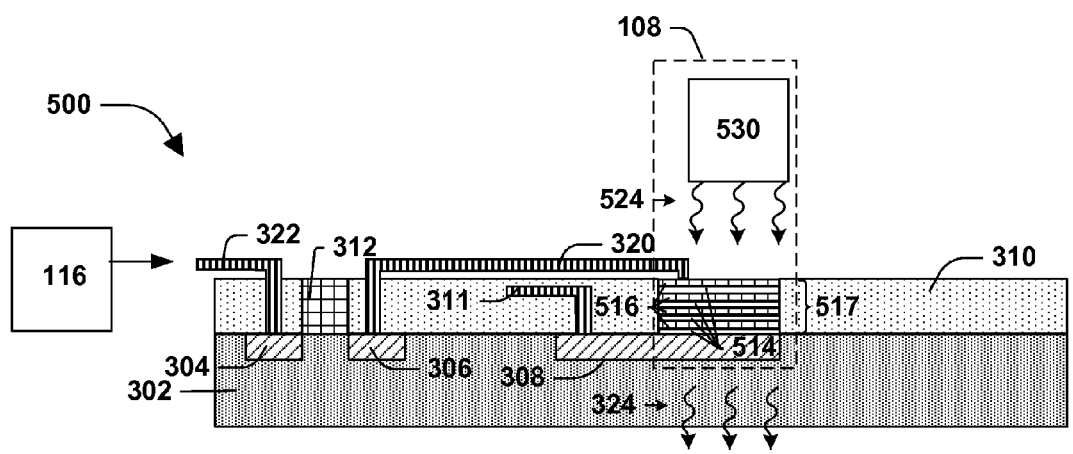
FIG. 10 is an illustration of a semiconductor arrangement, according to some embodiments.

In FIG. 10, the first metal connect 322, the second metal connect 320 and the third metal connect 311 are illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 4. In some embodiments, the second connect 320 is in connected to the second active area 306 and the electro-absorption modulator 517. According to some embodiments, the external laser 530 generates a laser signal 524, where the arrows indicate the propagation direction of the laser signal 524. In some embodiments, the laser signal 524 is applied to the electro-absorption modulator 517. In some embodiments, the serializer 116 sends a serial data output 118 to the electro-absorption modulator 517 comprising the data 124. In some embodiments, the laser signal 524 activates the electro-absorption modulator 517 to transform the laser signal 524 into a modulated light signal 324 comprising the serial data output 118, where the arrows indicate the propagation direction of the data 124 transmitted as the modulated light signal 324. In some embodiments, the first optical transmitter 108a, such as illustrated in FIG. 1, comprises the first external laser 530 in contact with the electro-absorption modulator 517 on the first layer 102a, such as illustrated in FIG. 10. In some embodiments, the first optical transmitter 108a, such as illustrated in FIG. 1, comprises a first external optical source, the first external optical source comprising a first vertical cavity laser array or a first fiber array with a lens coupler. In some embodiments, the second optical transmitter 108b, such as illustrated in FIG. 1, comprises a second external laser 530 in contact with the electro-absorption modulator 530 on the second layer 102b, such as illustrated in FIG. 10. In some embodiments, the second optical transmitter 108b, such as illustrated in FIG. 1, comprises a second external optical source, the second external optical source comprising a second vertical cavity laser array or a second fiber array with a lens coupler.

Figure 11:
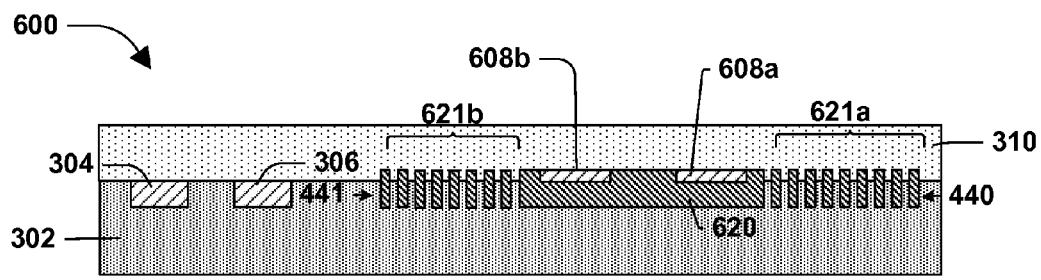
FIG. 11 is an illustration of a semiconductor arrangement, according to some embodiments.

Turning to FIG. 11, the substrate 302, the first active area 304, the second active area 306, the passivation layer 310 and a waveguide modulator 620 in the passivation layer 310 are illustrated, according to some embodiments. In some embodiments, the substrate 302, the first active area 304, the second active area 306 and the passivation layer 310, are formed as described above with regards to FIG. 2. In some embodiments, the waveguide modulator 620 comprises a first waveguide grating coupler 621a and a second waveguide grating coupler 261b. In some embodiments, the first waveguide grating coupler 621a comprises several segments with a distance between each segment. In some embodiments, the second waveguide grating coupler 621b comprises several segments with a distance between each segment. In some embodiments, the waveguide modulator 620 comprises at least one of silicon, germanium, tin, or at least one of group 3 elements, such as aluminum, indium, or gallium, or group 5 elements, such as arsenic, phosphorous, antimony. In some embodiments, the waveguide modulator 620 is formed by at least one of epitaxial growth or wafer-level bonding. In some embodiments, the waveguide modulator 620 comprises a first waveguide contact 608a and a second waveguide contact 608b, where at least one of the first waveguide contact 608a or the second waveguide contact 608b is a low resistance contact, such as a metal.

Figure 12:
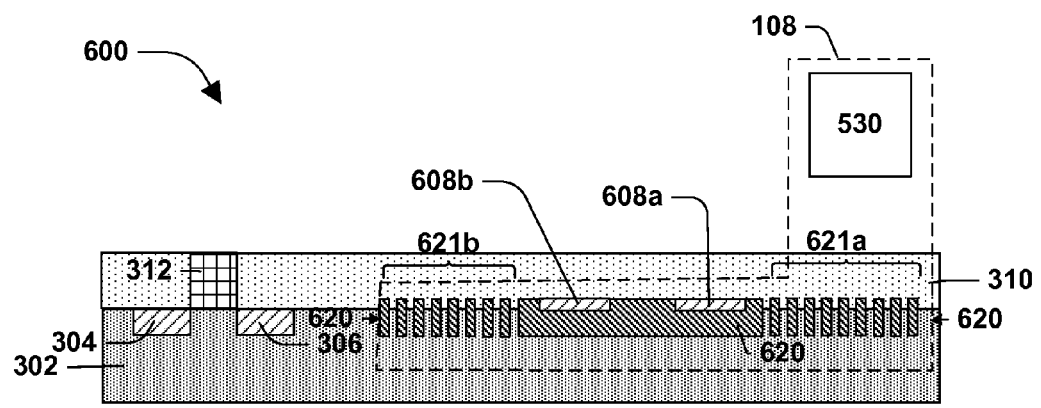
FIG. 12 is an illustration of a semiconductor arrangement, according to some embodiments.

In FIG. 12, a gate 312 between the first active area 304 and the second active area 306 in the passivation layer, which forms a transistor, and an optical transmitter 108 comprising the external laser 530 and the waveguide modulator 517 are illustrated, according to some embodiments. In some embodiments, the gate 312 is formed as described above with regards to the gate 312, as illustrated in FIG. 3. In some embodiments, the external laser 530 comprises a laser, such as a vertical cavity laser or a fiber array with lens coupler.

Figure 13:
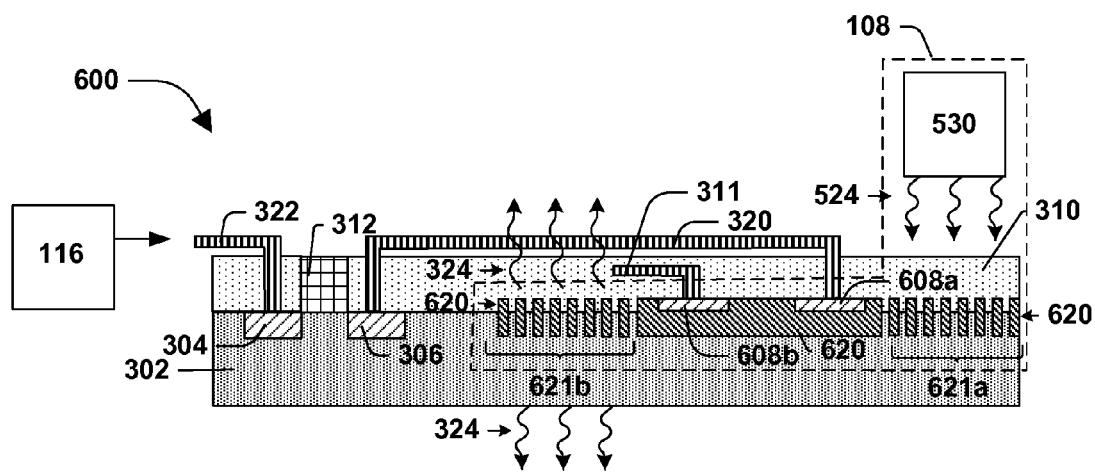
FIG. 13 is an illustration of a semiconductor arrangement, according to some embodiments.

In FIG. 13, the first metal connect 322, the second metal connect 320 and the third metal connect 311 are illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 4. In some embodiments, the second connect 320 is connected to the second active area 306 and the first waveguide contact 608a, and the third connect 311 is connected to the second waveguide contact 608b. According to some embodiments, the external laser 530 generates a laser signal 524, where the arrows indicate the propagation direction of the laser signal 524. In some embodiments, the serializer 116 sends a serial data output 118 to the waveguide modulator 630 comprising the data 124. In some embodiments, the laser signal 524 is applied to the first waveguide grating coupler 621a. In some embodiments, the laser signal 524 activates the waveguide modulator 620 to transform the laser signal 524 into a modulated light signal 324 comprising the serial data output 118. In some embodiments, the modulated light signal 324 is transmitted from the second waveguide grating coupler 621b, where the arrows indicate the propagation direction of the data 124 transmitted as the modulated light signal 324. In some embodiments, the first optical transmitter 108a, such as illustrated in FIG. 1, comprises the first external laser 530 in contact with the waveguide modulator 620 on the first layer 102a, such as illustrated in FIG. 13. In some embodiments, the first optical transmitter 108a, such as illustrated in FIG. 1, comprises a first external optical source, the first external optical source comprising a first vertical cavity laser array or a first fiber array with a lens coupler. In some embodiments, the second optical transmitter 108b, such as illustrated in FIG. 1, comprises a second external laser 530 in contact with the waveguide modulator 620 on the second layer 102b, such as illustrated in FIG. 13. In some embodiments, the second optical transmitter 108b, such as illustrated in FIG. 1, comprises a second external optical source, the second external optical source comprising a second vertical cavity laser array or a second fiber array with a lens coupler.

According to some embodiments, the first optical receiver 110a comprises at least one of a first photodiode or a first photo-transistor. According to some embodiments, the second optical receiver 110b comprises at least one of a second photodiode or a second photo-transistor. According to some embodiments, the first optical receiver 110a comprising the first photodiode or the second optical receiver 110b comprising the second photodiode is illustrated in FIGS. 14-19. According to some embodiments, the first optical receiver 110a comprising the first photo-transistor or the second optical receiver 110b comprising the second photo-transistor is illustrated in FIGS. 20-25.

Figure 14:
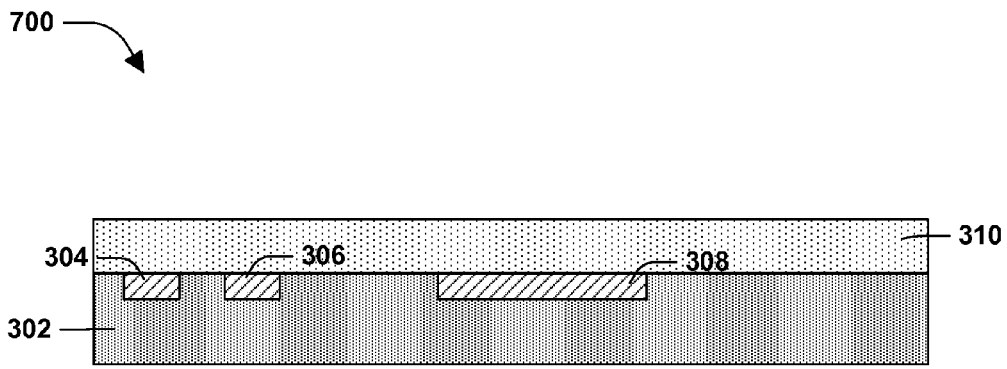
FIG. 14 is an illustration of a semiconductor arrangement, according to some embodiments.

Turning to FIG. 14, the substrate 302, the first active area 304, the second active area 306, the first doped area 308 and the passivation layer 310, which are formed as described above with regards to FIG. 2 are illustrated, according to some embodiments.

Figure 15:
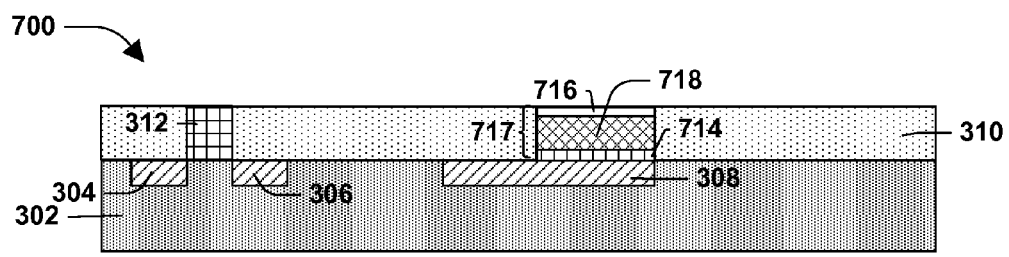
FIG. 15 is an illustration of a semiconductor arrangement, according to some embodiments.

In FIG. 15, a gate 312 between the first active area 304 and the second active area 306 in the passivation layer, which forms a transistor, and a photodiode 717 in the passivation layer 310 are illustrated, according to some embodiments. In some embodiments, the gate 312 is formed as described above with regards to the gate 312, as illustrated in FIG. 3. In some embodiments, the optical receiver 110 comprises the photodiode 717. In some embodiments, the photodiode 717 comprises a p-i-n junction comprising a first photodiode junction 716, a second photodiode junction 714 and an intrinsic area 718. In some embodiments, the first photodiode junction 716 comprises at least one of a positive type junction or negative type junction. In some embodiments, the second photodiode junction 714 comprises a positive type junction when the first photodiode junction 716 comprises a negative type junction. In some embodiments, the second photodiode junction 714 comprises a negative type junction when the first photodiode junction 716 comprises a positive type junction. In some embodiments, the photodiode 717 comprises at least one of silicon, germanium, tin, or at least one of group 3 elements, such as aluminum, indium, or gallium, or group 5 elements, such as arsenic, phosphorous, antimony. In some embodiments, the photodiode 717 is formed by at least one of epitaxial growth or wafer-level bonding.

Figure 16:
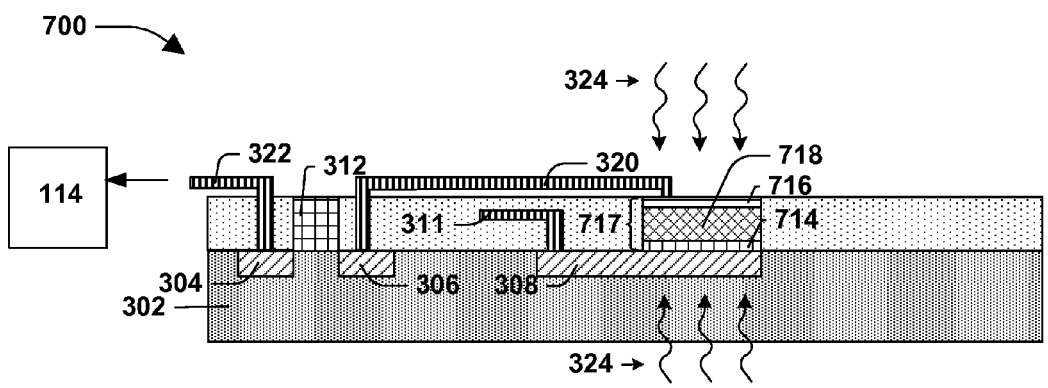
FIG. 16 is an illustration of a semiconductor arrangement, according to some embodiments.

In FIG. 16, the first metal connect 322, the second metal connect 320 and the third metal connect 311 are illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 4. In some embodiments, the second metal connect is connected to the second active area 306 and the photodiode 717. In some embodiments, the transistor acts a switch to activate conduction from the photodiode 717 to the memory macros 122. In some embodiments, the photodiode 717 receives modulated light signals 324, where the arrows indicate the propagation direction of the data 124 received as modulated light signals 324. In some embodiments, the data 124 is converted from modulated light signals 324 that transmit the data 124, to an electrical data signal that comprises a serial data input 120. In some embodiments, the deserializer 114 converts the serial data input 120 received from the optical receiver 110 into a parallel data output 128. In some embodiments, the first optical receiver 110a, such as illustrated in FIG. 1, comprises a first photodiode 717 on the first layer 102a, as illustrated in FIG. 16. In some embodiments, the second optical receiver 110b, such as illustrated in FIG. 1 comprises a second photodiode 717 on the second layer 102b, such as illustrated in FIG. 16.

Figure 17:
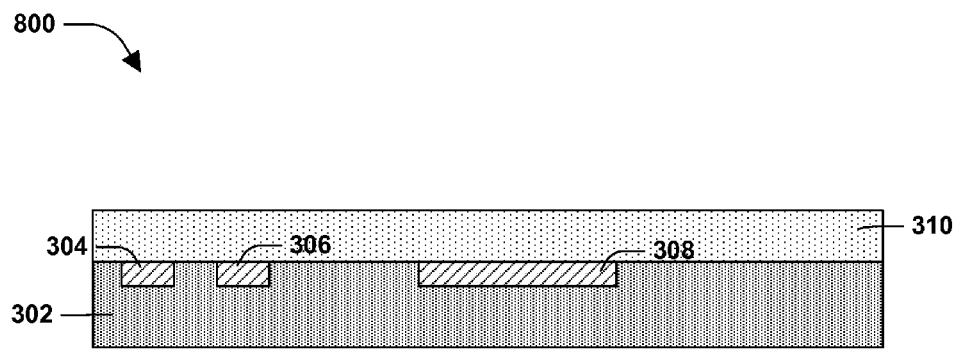
FIG. 17 is an illustration of a semiconductor arrangement, according to some embodiments.

Turning to FIG. 17, the substrate 302, the first active area 304, the second active area 306, the first doped area 308 and the passivation layer 310 are illustrated, which are formed as described above with regards to FIG. 2, according to some embodiments.

Figure 18:
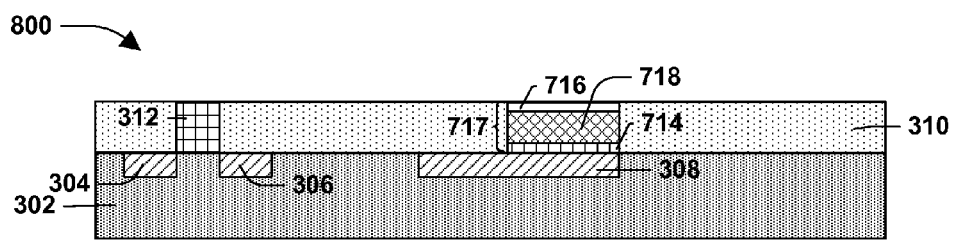
FIG. 18 is an illustration of a semiconductor arrangement, according to some embodiments.

In FIG. 18, a gate 312 is illustrated between the first active area 304 and the second active area 306 in the passivation layer, which forms a transistor, and a photodiode 717 in the passivation layer 310 are illustrated, according to some embodiments. In some embodiments, the gate 312 is formed as described above with regards to the gate 312, as illustrated in FIG. 3. In some embodiments, the photodiode is formed as described above with regards to the photodiode 717, as illustrated in FIG. 15.

Figure 19:
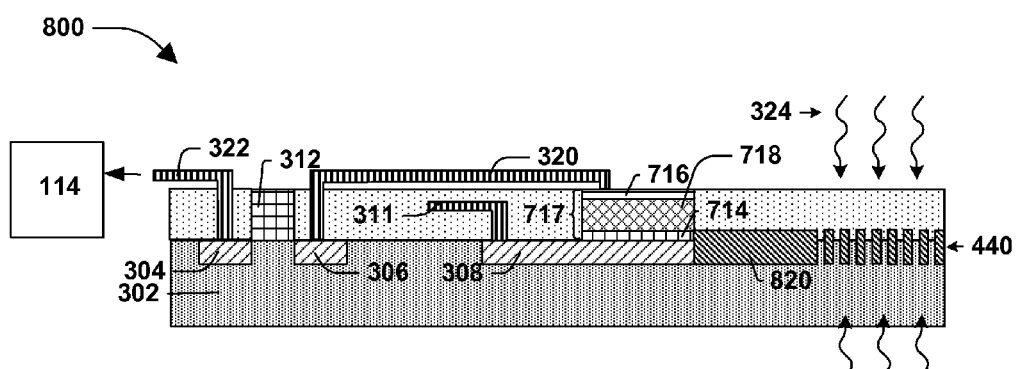
FIG. 19 is an illustration of a semiconductor arrangement, according to some embodiments.

In FIG. 19, the first metal connect 322, the second metal connect 320, the third metal connect 311, a plasmonic waveguide 820 and a grating coupler 440 connected to the photodiode 717 are illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 16. In some embodiments, the plasmonic waveguide 820 comprises patterned metal nano-wires surrounded by a dielectric material. In some embodiments, the grating coupler 440 comprises one of a metal or a high dielectric material. In some embodiments, the grating coupler 440 comprises several segments with a distance between each segment. In some embodiments, the modulated light signals 324 are input into the grating coupler 440. In some embodiments, the modulated light signal 324 passes though the grating coupler 440 and the plasmonic waveguide 820 and are applied onto the photodiode 717. In some embodiments, the photodiode 717 transforms the modulated light single 324 into electrical data signals comprising a serial data input 120. In some embodiments, the serial data input 120 is sent to the deserializer 114. In some embodiments, the first optical receiver 110a, such as illustrated in FIG. 1 comprises a first photodiode 717 connected to a first plasmonic waveguide 820 and a first grating coupler 420 on the first layer 102a, such as illustrated in FIG. 19. In some embodiments, the second optical receiver 110b, such as illustrated in FIG. 1, comprises a second photodiode 717 connected to a second plasmonic waveguide 820 and a second grating coupler 420 on the second layer 102b, as illustrated in FIG. 19.

Figure 20:
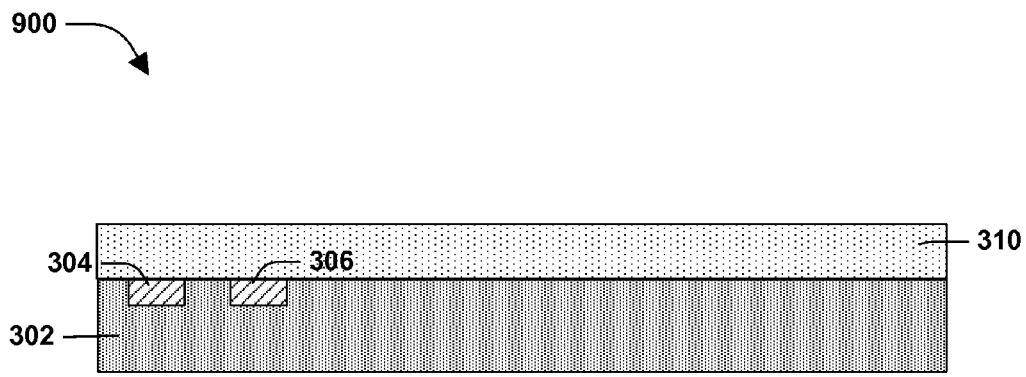
FIG. 20 is an illustration of a semiconductor arrangement, according to some embodiments.

Turning to FIG. 20, the substrate 302, the first active area 304, the second active area 306, the first doped area 308 and the passivation layer 310 are illustrated, which are formed as described above with regards to FIG. 2, according to some embodiments.

Figure 21:
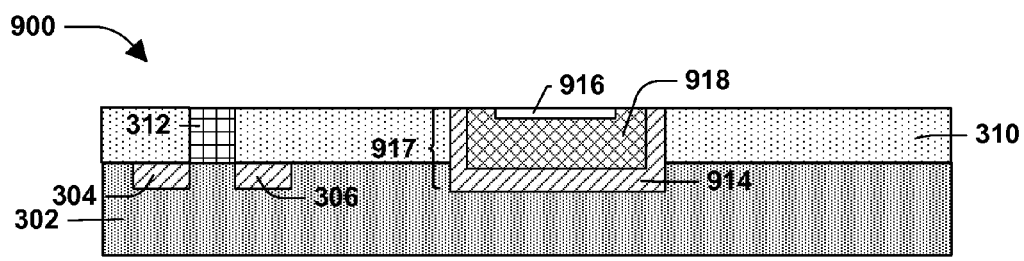
FIG. 21 is an illustration of a semiconductor arrangement, according to some embodiments.

In FIG. 21, a gate 312 between the first active area 304 and the second active area 306 in the passivation layer, which forms a transistor and an optical receiver 110 comprising a photo-transistor 917 in the passivation layer 310 are illustrated, according to some embodiments. In some embodiments, the gate 312 is formed as described above with regards to the gate 312, as illustrated in FIG. 3. In some embodiments, the photo-transistor 917 comprises a first transistor layer 914, a second transistor layer 918, and a third transistor layer 916. In some embodiments, the first transistor layer 914 and the third transistor layer 916 comprise at least one of a positive type junction or a negative type junction. In some embodiments, the second transistor layer 918 comprises a positive type junction if the first transistor layer 914 and the third transistor layer 916 comprise a negative type junction. In some embodiments, the second transistor layer 918 comprises a negative type junction if the first transistor layer 914 and the third transistor layer 916 comprise a positive type junction. In some embodiments, the phototransistor 917 comprises at least one of silicon, germanium, tin, or at least one of group 3 elements, such as aluminum, indium, or gallium, or group 5 elements, such as arsenic, phosphorous, antimony. In some embodiments, the phototransistor 917 is formed by at least one of epitaxial growth or wafer-level bonding.

Figure 22:
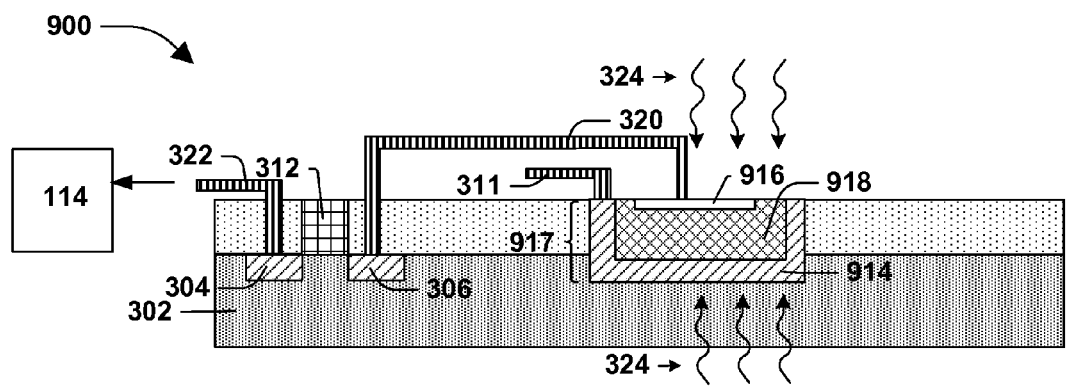
FIG. 22 is an illustration of a semiconductor arrangement, according to some embodiments.

In FIG. 22, the first metal connect 322, the second metal connect 320 and the third metal connect 311 are illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 4. In some embodiments, the second metal connect 320 is connected to the second active area 306 and the third transistor layer 916. In some embodiments, the third metal connect 311 is connected to the first transistor layer 914. In some embodiments, the transistor acts as a switch to activate conduction from the photo-transistor 917 to the memory macros 122. In some embodiments, the photo-transistor 917 receives modulated light signals 324, where the arrows indicate the propagation direction of the data 124 received as modulated light signals 324. In some embodiments, the data 124 is converted from the modulated light signals 324 that transmit the data 124, to an electrical data signal that comprises a serial data input 120. In some embodiments, the deserializer 114 converts the serial data input 120 received from the optical receiver 110 into a parallel data output 128. In some embodiments, the first optical receiver 110a, such as illustrated in FIG. 1, comprises a photo-transistor 917 on the first layer 102a, such as illustrated in FIG. 22. In some embodiments, the second optical receiver 110b, such as illustrated in FIG. 1, comprises a second photo-transistor 917 on the second layer 102b, such as illustrated in FIG. 22.

Figure 23:
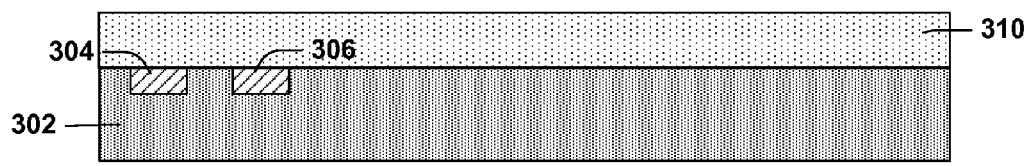
FIG. 23 is an illustration of a semiconductor arrangement, according to some embodiments.

Turning to FIG. 23, the substrate 302, the first active area 304, the second active area 306, the first doped area 308 and the passivation layer 310 are illustrated, which are formed as described above with regards to FIG. 2, according to some embodiments.

Figure 24:
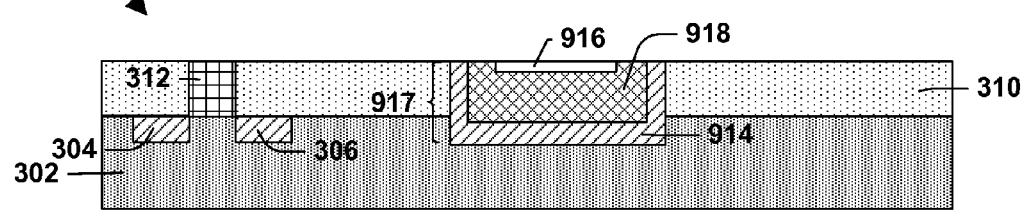
FIG. 24 is an illustration of a semiconductor arrangement, according to some embodiments.

In FIG. 24, a gate 312 is between the first active area 304 and the second active area 306 in the passivation layer, which forms a transistor, and the photo-transistor 917 in the passivation layer 310 are illustrated, according to some embodiments. In some embodiments, the gate 312 is formed as described above with regards to the gate 312, as illustrated in FIG. 3. In some embodiments, the photo-transistor 917 is formed as described above with regards to the photo-transistor 917, as illustrated in FIG. 21.

Figure 25:
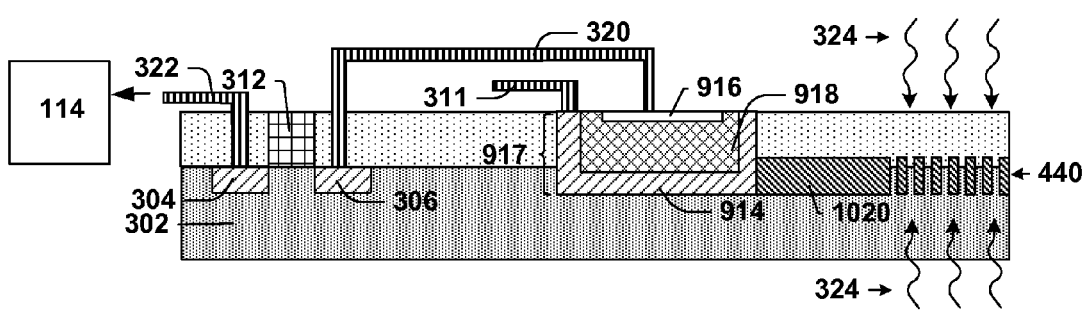
FIG. 25 is an illustration of a semiconductor arrangement, according to some embodiments.

In FIG. 25, the first metal connect 322, the second metal connect 320, the third metal connect 311 and a plasmonic waveguide 1020 and a grating coupler 420 are illustrated, according to some embodiments. In some embodiments, the first metal connect 322, the second metal connect 320 and the third metal connect 311 are formed as described above with regard to the first metal connect 322, the second metal connect 320 and the third metal connect 311 as illustrated in FIG. 22. In some embodiments, the transistor acts as a switch to activate conduction from the photo-transistor 917 to the memory macros 122. In some embodiments, the modulated light signal 324 is input into the grating coupler 440 where the arrows indicate the propagation direction of the data 124 received as modulated light signals 324. In some embodiments, the modulated light signal 324 passes though the plasmonic waveguide 1020 and is applied onto the photo-transistor 917. In some embodiments, the photo-transistor 917 transforms the modulated light signal 324 into electrical data signals that comprise a serial data input 120. In some embodiments, the deserializer 114 converts the serial data input 120 received from the optical receiver 110 into a parallel data output 128. In some embodiments, the first optical receiver 110a, such as illustrated in FIG. 1, comprises a first photo-transistor 917 connected to a first plasmonic waveguide 1020 and a first grating coupler 420 on the first layer 102a, as illustrated in FIG. 25. In some embodiments, the second optical receiver 110b, such as illustrated in FIG. 1, comprises a second phototransistor 917 connected to a second plasmonic waveguide 1020 and a second grating coupler 420 on the second layer 102b, such as illustrated in FIG. 25.

Figure 26:
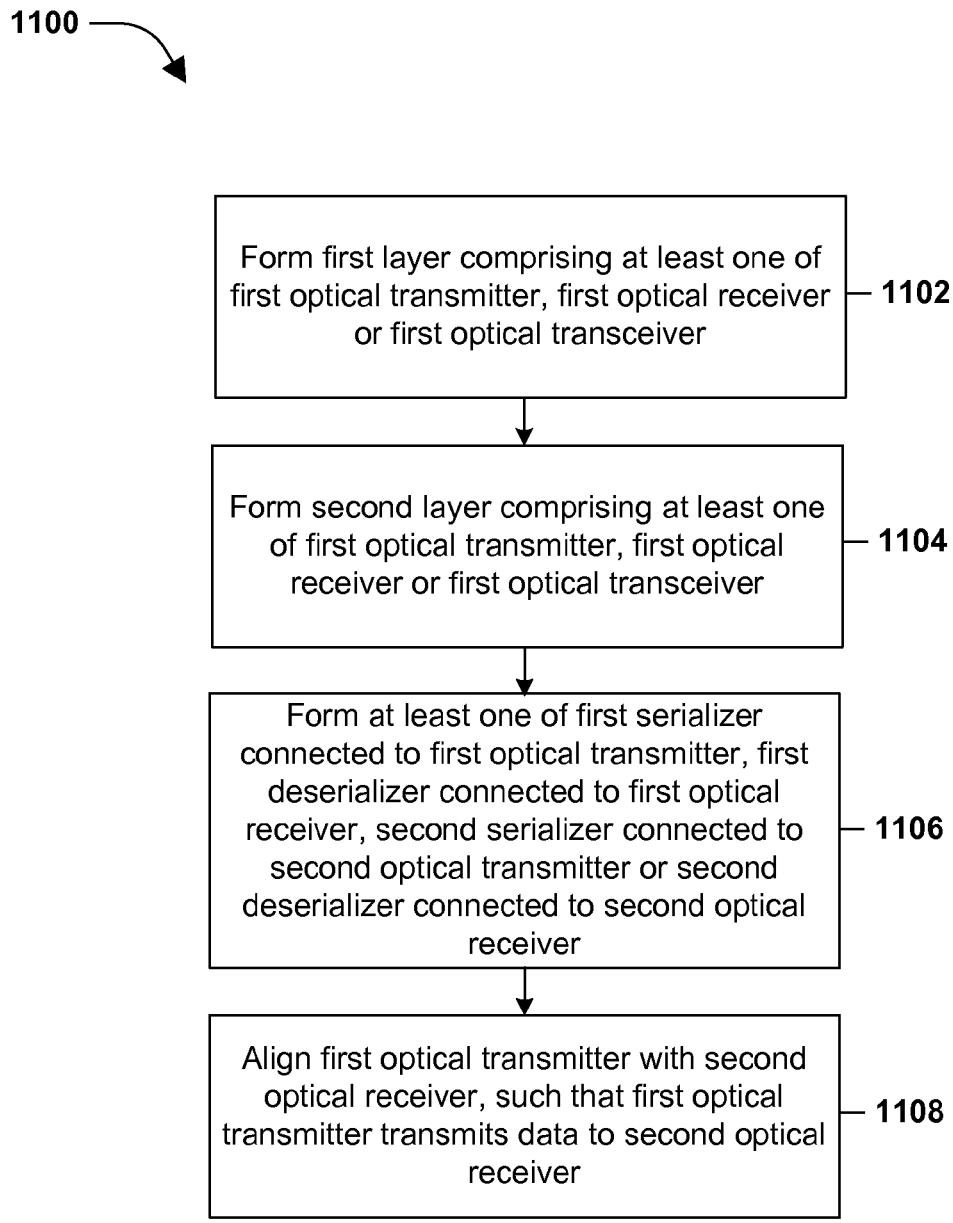
FIG. 26 is a flow diagram illustrating a method of forming a semiconductor arrangement, according to some embodiments.

An example method 1100 of forming a semiconductor arrangement, such as semiconductor arrangement 100 according to some embodiments, is illustrated in FIG. 26.

At 1102, according to some embodiments, a first layer 102a comprising at least one of a first optical transmitter 108a, a first optical receiver 110a or a first optical transceiver 106a is formed, as illustrated in FIG. 1. In some embodiments, the first optical transceiver 106a comprises at least one of the first optical transmitter 108a or the first optical receiver 110a.

At 1104, according to some embodiments, a second layer 102b comprising at least one of a second optical transmitter 108b, a second optical receiver or a second optical transceiver 106b is formed, as illustrated in FIG. 1. In some embodiments, the second optical transceiver 106a comprises at least one of the second optical transmitter 108a or the second optical receiver 110a.

At 1106, according to some embodiments, at least one of a first serializer 116a connected to the first optical transmitter 108a, a first deserializer 114a connected to the first optical receiver 110a, a second serializer 116b connected to the second optical transmitter 108b, or a second deserializer 114a connected to the second optical receiver 110b are formed, as illustrated in FIG. 1.

At 1108, the first optical transmitter 108a is aligned with the second optical receiver 110b, such that the first optical transmitter 108a transmits data 124a to the second optical receiver 110b. In some embodiment, the first optical transmitter 108a transmits alignment data to the second optical receiver 110a to determine an amount of alignment data received. In some embodiments, the first layer 102a position or the second layer 102b position is adjusted until the amount of alignment data received by the second optical receiver 110b meets an alignment threshold. In some embodiments, the alignment threshold is met when the second optical receiver 110b receives greater than 50% of the alignment signal transmitted by the first optical transmitter 108a.

According to some embodiments, a semiconductor arrangement comprises a three dimensional (3D) integrated circuit (IC) structure. In some embodiments, the 3D IC structure comprises a first layer comprising a first optical transmitter and a second layer comprising a second optical transmitter over the first layer. In some embodiments, the first optical transmitter is configured to transmit data from the first layer to the second layer and the second optical transmitter is configured to transmit data from the second layer to the first layer.

According to some embodiments, a method of making a semiconductor arrangement comprises forming a three dimensional (3D) integrated circuit (IC) structure. The forming the 3D IC structure comprising forming a first layer comprising a first optical transmitter, forming a second layer comprising a second optical receiver and aligning the first optical transmitter with the a second optical receiver, such that the first optical transmitter transmits data to the first optical receiver.

According to some embodiments, a semiconductor arrangement comprises a three dimensional (3D) integrated circuit (IC) structure. In some embodiments, the 3D IC structure comprises a first layer comprising a first optical transmitter and a second layer comprising a second optical receiver. In some embodiments, the second layer is over the first layer. In some embodiments, the first optical transmitter is configured to transmit data to the second optical receiver, the data comprising a clock signal.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
   a three dimensional (3D) integrated circuit (IC) structure comprising:
      a first layer comprising:
         a gate of a transistor; and
         a first optical transmitter, wherein a first source/drain region of the transistor is coupled to a first serializer and a second source/drain region of the transistor is coupled to the first optical transmitter, the transistor configured to selectively couple the first optical transmitter to the first serializer; and
      a second layer comprising a second optical transmitter over the first layer, the first optical transmitter configured to transmit data from the first layer to the second layer and the second optical transmitter configured to transmit data from the second layer to the first layer.

2. The semiconductor arrangement of claim 1, at least one of:
   the first layer comprising at least one of a first optical transceiver or a first optical receiver, the first optical transceiver comprising the first optical transmitter and the first optical receiver; or
   the second layer comprising at least one of a second optical transceiver or a second optical receiver, the second optical transceiver comprising the second optical transmitter and the second optical receiver.

3. The semiconductor arrangement of claim 2, the first layer comprising a first deserializer connected to the first optical receiver.

4. The semiconductor arrangement of claim 3, the second layer comprising at least one of a second serializer connected to the second optical transmitter or a second deserializer connected to the second optical receiver.

5. The semiconductor arrangement of claim 2, at least one of:
   the first optical transmitter comprising at least one of a first internal optical source or a first external optical source; or
   the second optical transmitter comprising at least one of a second internal optical source or a second external optical source.

6. The semiconductor arrangement of claim 5, at least one of:
   the first internal optical source comprising one of a first vertical cavity laser, a first hybrid laser, or a first SiGe laser; or
   the second internal optical source comprising one of a second vertical cavity laser, a second hybrid laser, or a second SiGe laser.

7. The semiconductor arrangement of claim 5, at least one of:
   the first external optical source comprising one of a first vertical cavity laser array or a first fiber array with a lens coupler; or the second external optical source comprising one of a second vertical cavity laser array or a second fiber array with a lens coupler.

8. The semiconductor arrangement of claim 5, at least one of:
the first optical receiver comprising at least one of a first photodiode or a first photo-transistor; or
the second optical receiver comprising at least one of a second photodiode or a second photo-transistor.

9. The semiconductor arrangement of claim 1, the data comprising a clock signal.

10. The semiconductor arrangement of claim 2, at least one of the first optical transmitter, the second optical transmitter, the first optical receiver or the second optical receiver connected to a transistor.

11. A method of making a semiconductor arrangement comprising:
forming a three dimensional (3D) integrated circuit (IC) structure comprising:
forming a first layer;
etching the first layer to form a first opening between a first source/drain region and a second source/drain region and a second opening over a doped region;
forming a gate within the first opening and forming a first optical transmitter within the second opening;
forming a second layer comprising a second optical receiver; and
aligning the first optical transmitter with the second optical receiver, such that the first optical transmitter transmits data to the second optical receiver.

12. The method of claim 11, the aligning comprising:
transmitting alignment data from the first optical transmitter; and
determining an amount of the alignment data received by the second optical receiver.

13. The method of claim 11, at least one of:
the forming a first layer comprising forming a first optical transceiver or a first optical receiver, the first optical transceiver comprising the first optical transmitter and the first optical receiver; or
the forming a second layer comprising forming a second optical transceiver or a second optical transmitter, the second optical transceiver comprising the second optical transmitter and the second optical receiver.

14. The method of claim 13, at least one of:
the forming a first layer comprising forming a first serializer connected to the first optical transmitter; or
the forming a first layer comprising forming a first deserializer connected to the first optical receiver.

15. The method of claim 14, at least one of:
the forming a second layer comprising forming a second serializer connected to the second optical transmitter; or
the forming a second layer comprising forming a second deserializer connected to the second optical receiver.

16. The method of claim 13, at least one of:
forming a first internal optical source within the first layer to form the first optical transmitter; or
forming a second internal optical source within the second layer to form the second optical transmitter.

17. The method of claim 13, at least one of:
forming at least one of a first photodiode or a first photo-transistor within the first layer to form the first optical receiver; or
forming at least one of a second photodiode or a second photo-transistor within the second layer to form the second optical receiver.

18. A semiconductor arrangement comprising:
a three dimensional (3D) integrated circuit (IC) structure comprising:
a first layer comprising a first optical transmitter; and
a second layer over the first layer comprising:
a gate of a transistor; and
a second optical receiver, wherein a first source/drain region of the transistor is coupled to a deserializer and a second source/drain region of the transistor is coupled to the second optical receiver, the transistor configured to selectively couple the second optical receiver to the deserializer, the first optical transmitter configured to transmit data to the second optical receiver.

19. The semiconductor arrangement of claim 18, at least one of:
the first layer comprising at least one of a first optical transceiver or a first optical receiver, the first optical transceiver comprising the first optical transmitter and the first optical receiver; or
the second layer comprising at least one of a second optical transceiver or a second optical transmitter, the second optical transceiver comprising the second optical transmitter and the second optical receiver.

20. The semiconductor arrangement of claim 19,
the first layer comprising at least one of:
a first serializer connected to the first optical transmitter; or
a second deserializer connected to the first optical receiver.

* * * * *